(12) United States Patent
Taravade et al.

(10) Patent No.: US 6,864,020 B1
(45) Date of Patent: Mar. 8, 2005

(54) CHROMELESS PHASE SHIFT MASK USING NON-LINEAR OPTICAL MATERIALS

(75) Inventors: Kunal Taravade, Portland, OR (US); Neal Callan, Lake Oswego, OR (US)

(73) Assignee: LSI Logic Corporation, Milpitas, CA (US)

( * ) Notice: Subject to any disclaimer, the term of this patent is extended or adjusted under 35 U.S.C. 154(b) by 101 days.

(21) Appl. No.: 10/328,346

(22) Filed: Dec. 24, 2002

(51) Int. Cl.[7] .............................................. G03F 9/00
(52) U.S. Cl. ............................................................ 430/5
(58) Field of Search .................. 430/5, 394; 250/492.2; 356/399, 401

(56) References Cited

U.S. PATENT DOCUMENTS 6,721,040 B2 * 4/2004 Saito et al. ................... 355/69

* cited by examiner

Primary Examiner—S. Rosasco
(74) Attorney, Agent, or Firm—Beyer Weaver Thomas

(57) ABSTRACT

An attenuated phase shift mask is formed using a non-linear optical material for both fiducial features and pattern features. The non-linear optical material selected has predetermined transmission at the actinic exposure wavelength and a smaller transmission at the fiducial recognition wavelengths.

20 Claims, 3 Drawing Sheets

CHROMELESS PHASE SHIFT MASK USING NON-LINEAR OPTICAL MATERIALS

BACKGROUND OF THE INVENTION

1. Field of the Invention

The present invention relates to the formation of patterns on photolithography masks used to form patterns on semiconductor wafers. More particularly, the present invention relates to the formation of attenuating phase shift masks used for the fabrication of semiconductor integrated circuits.

2. Description of the Related Art

Semiconductor wafer fabrication involves a series of processes used to create semiconductor devices and integrated circuits (ICs) in and on a semiconductor wafer surface. Fabrication typically involves the basic operations of layering and patterning, together with others such as doping, and heat treatments. Layering is an operation used to add thin layers of material (typically insulator, semiconductor or conductor) to the surface of the semiconductor wafer. Patterning is an operation that is used to remove specific portions of the top layer or layers on the wafer surface. Patterning is usually accomplished through the use of photolithography (also known as photomasking) to transfer the semiconductor design to the wafer surface. A photomask (also known as a reticle) is used to provide a pattern for transfer to the wafer surface. As the push to maintain Moore's Law is producing smaller and smaller semiconductor circuits, increasing demands are placed upon the process equipment to provide the necessary resolution. To produce the smaller sized devices, the useful lifetime for equipment designed for particular device sizes is often extended by using resolution enhancement techniques (RETs) on the photomasks. For example, significant improvements in resolution and depth of focus have been demonstrated using phase shifting techniques. One of these techniques uses attenuated phase shift masks.

Attenuated Phase Shift Masks include selectively placed patterns of attenuating material, such as, for example, molybdenum silicide (MoSi) on quartz. MoSi typically allows a small percentage of the light to pass through the mask, such as, for example, 6%, in comparison to the approximate 0% allowed by the chrome used in conventional optical lithography masks. However, the thickness of the MoSi is chosen so that the light that does pass through is 180° out of phase with the light that passes through the neighboring clear quartz areas. The light that is transmitted through the MoSi pattern has an intensity that is insufficient to expose the resist. The phase difference causes the intensity of the transmitted light imaged on the wafer photoresist layer to be "darker" than similar features produced using chrome patterns. The result is a sharper intensity profile that allows smaller features to be printed on the wafer. That is, the edges become sharper as a result of the small amount of 180-degree phase shifted light destructively interfering with the light passing through the feature. But chrome still finds use in the formation of alignment marks (i.e., fiducials) on the phase shift masks.

In order to make useful devices the patterns for different lithography steps that belong to a single structure must be aligned to one another. Existing attenuated phase shift masks require a chrome border area around the pattern portions of the mask. The border area contains reticle alignment fiducials and other structures that the stepper needs to perform functions such as bar code recognition and reticle alignment. This is necessitated because the phase shifting films currently used in this scheme (such as MoSi and TiN/SiN) are not sufficiently opaque at the wavelengths that the stepper uses for the above functions. While these materials provide good phase shifting and contrast at the exposure wavelengths (which are in the deep UV regime), they let too much light through at the non-exposure wavelengths, which are in the visible regime. As a result, these peripheral fiducial structures on the reticle cannot be defined in these materials, and require a chrome film and a second (non-critical) chrome patterning step in the mask making process. This second patterning step can cause chrome defects on top of the phase shifting layer, which are hard to clean or remove, thus reducing the overall yield of the process. These steps often result in lower yield and higher manufacturing cost.

Accordingly, it is desirable to provide alternative materials for use in attenuating phase shift masks which have desirable phase shift and transmission characteristics for the formation of patterns yet have sufficient opacity for use in fiducials.

SUMMARY OF THE INVENTION

To achieve the foregoing, the present invention provides methods and photomasks for patterning layers on wafers using a single material for producing both the patterns and fiducials. A non-linear optical material is used in place of existing attenuated phase shift films as a way to avoid using a chrome layer on the mask. Thus, the mask contains only one type of film, namely the non-linear optical material, which accomplishes both tasks, namely providing the correct phase shift and transmission at the exposure wavelengths and sufficient opacity at the non-exposure wavelengths. This is possible because of the unique properties of these materials. That is, the optical parameters such as the index of refraction (n), coefficient of absorption (k), and transmission depend on the intensity of the incident beam, in addition to wavelength.

In one embodiment, the present invention provides an attenuated phase shift mask for forming a pattern on a semiconductor wafer. The phase shift mask includes a pattern feature formed in a portion of the mask to be imaged and printed on a wafer and formed from a non-linear optical material. The mask also includes a fiducial formed from the non-linear optical material.

In another embodiment, the non-linear optical material has a substantially uniform thickness and the thickness is selected to provide a predetermined phase and transmission at the pattern exposure wavelength and a second lower transmission at wavelengths used for fiducial recognition functions.

In another embodiment, a method of forming a pattern on a semiconductor wafer is provided. The method includes aligning an attenuating phase shift mask with one of a stepper and a wafer, by projecting a fiducial recognition illumination source through at least one fiducial formed from a non-linear optical material. The method further includes forming a feature pattern on the wafer by projecting illumination through phase shift mask feature patterns formed from the non-linear optical material.

These and other features and advantages of the present invention are described below with reference to the drawings.

DETAILED DESCRIPTION OF PREFERRED EMBODIMENTS

Reference will now be made in detail to preferred embodiments of the invention. Examples of the preferred embodiments are illustrated in the accompanying drawings. While the invention will be described in conjunction with these preferred embodiments, it will be understood that it is not intended to limit the invention to such preferred embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

The present invention provides methods and photomasks for patterning layers on wafers using a single material film for producing both the patterns and fiducials. A non-linear optical material is used in place of existing attenuated phase shift films and alignment marks, thus avoiding a chrome layer on the mask. Thus, the mask contains only one type of film, namely the non-linear optical material, which accomplishes both tasks, namely providing the correct phase shift and transmission at the exposure wavelengths and sufficient opacity at the non-exposure wavelengths. This is possible because of the unique properties of these materials. That is, the optical parameters such as the index of refraction (n), coefficient of absorption (k), and transmission (T) depend on the intensity of the incident beam, in addition to wavelength. These properties allow the non-linear optical films to be used for both the formation of patterns on the wafer and alignment of the mask to the wafer.

Figure 1:
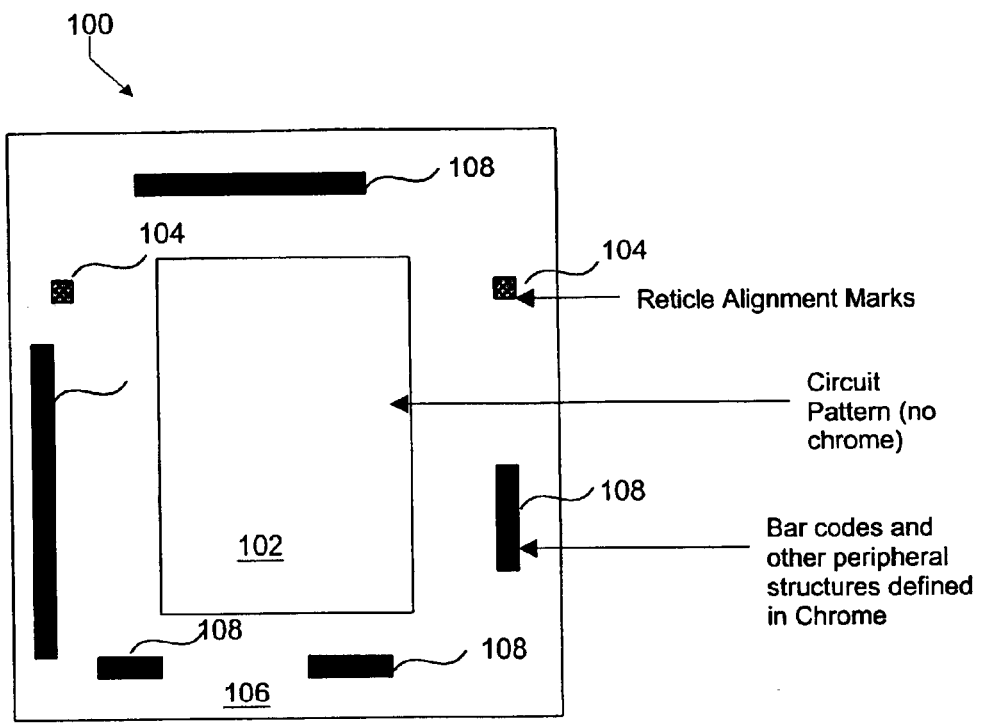
FIG. 1 is a diagram illustrating circuit patterns and reticle alignment marks used in conventional phase shift masks.

FIG. 1 is a diagram illustrating circuit patterns and reticle alignment marks used in conventional phase shift masks. As conventionally used, a phase shifting mask 100 typically contains a pattern area 102 for forming the attenuating phase shift patterns to be used in forming the patterns to be printed on the wafer. The patterns are formed without using chrome to define the patterns of the mask. That is, pattern area 102 will typically contain a patterned layer of MoSi (molybdenum silicide) or TiN/SiN. The pattern area 102 will not typically contain chrome materials. In order to align the reticle and the corresponding imaged pattern with other layers formed on the wafer, reticle alignment marks 104 are used and placed in the border area 106 surrounding the pattern area 102. Bar codes and other peripheral structures 108 may also be defined in the border area 106. These peripheral structures are typically defined in chrome in conventional processes due to the inability of the attenuating films to provide sufficient opacity at the visible wavelengths used for alignment functions.

The present invention uses non-linear optical films to form the pattern and border areas on optical photomasks. Non-linear optical materials exhibit non-linear variations in transmission of the incident illumination. The optical properties of non-linear materials change with change in the intensity of a beam of light that is directed at the material. This is especially true if a beam of high energy density (such as that from a laser) is incident upon the material. The polarization response is non-linear, as indicated in the equation below:

$$P = \epsilon_0 (\chi E + \chi^{(2)} E^2 + \chi^{(3)} E^3 + \ldots) \quad (1)$$

Where P=Polarization
X=First Order Susceptibility
$\chi^{(2)}$=Second Order Susceptibility
$\chi^{(3)}$=Third Order Susceptibility
$\epsilon_0$=Dielectric Constant If E is expressed as E=A cos(ωt+φ) where ω is the frequency of the incident beam, then from Eq. (1) above it is easily seen that the non-linear material generates harmonics of the incident frequency c. In addition to this, the optical properties (such as n, k and transmission) of these materials depend not only on the incident wavelength, but also on the incident intensity. Since the optical properties (n, k) of the material are intensity dependent, so too is the transmission T of light at a certain wavelength, since T is a function of (n, k). The present invention uses the non-linear properties, i.e., the variations in transmission of non-linear optical films to form attenuating phase shift masks having the patterns and the fiducials formed from the same non-linear optical film.

In one embodiment, the present invention provides a reduced transmission at the wavelength used for aligning the mask and other functions (bar code reading, etc) by adjusting the intensity of the fiducial recognition illumination source. Preferably, the intensity of the laser source used for these functions is varied until a sufficiently small transmission (close to 0) is obtained, which can then provide a good contrast for recognition of images such as reticle alignment marks and fiducials. The selected non-linear optical film can thus be made to serve the dual purpose of providing the correct phase and transmission at the exposure (DUV) wavelengths, as well as being sufficiently opaque at the fiducial recognition (visible) wavelengths, thereby fulfilling the function of the chrome layer.

The present invention is intended to encompass the use of all non-linear optical materials suitable to be disposed on a substrate. For example, LiNbO3—Lithium Niobate, KTiOPO4—Potassium Titanyl Phosphate, and RbTiOPO4—Rubidium Titanyl Phosphate are all known non-linear optical materials which are expected to be suitable for disposition and patterning on a substrate, such as, for example, a quartz substrate commonly used for photolithography masks. The materials identified above are intended to be illustrative and not limiting. As a further example, organic non-linear optical materials may also be used in addition to the organic materials identified above.

Figure 2:
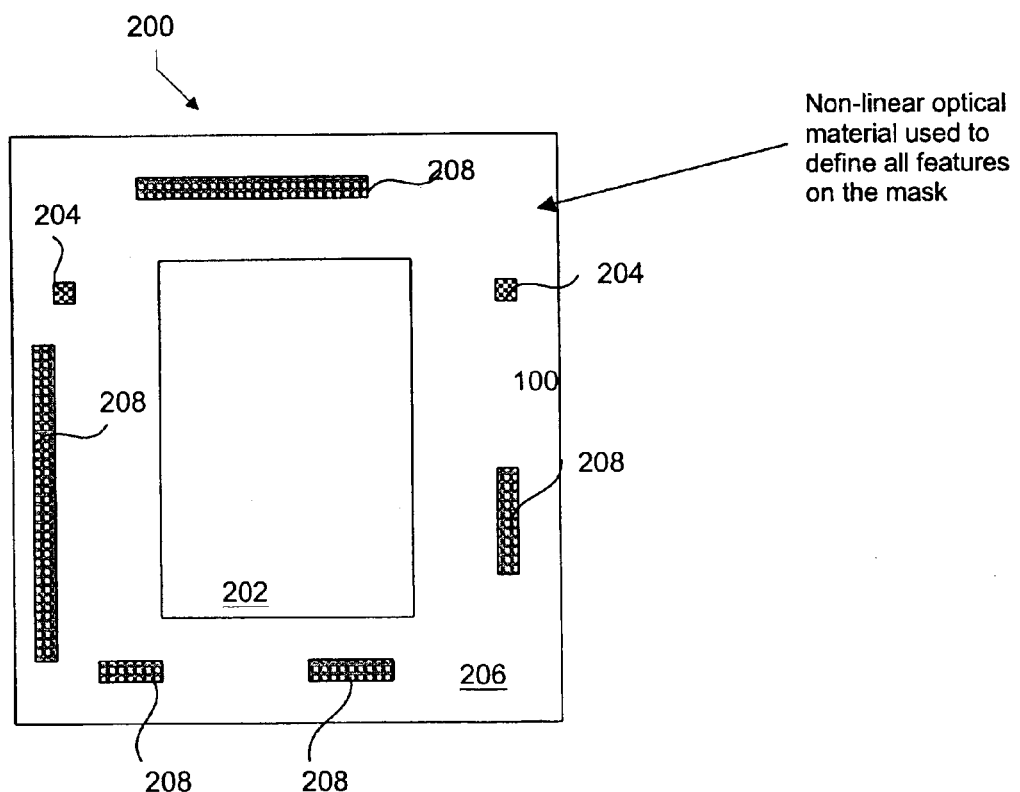
FIG. 2 is a diagram illustrating circuit pattern areas and reticle alignment marks used in accordance with one embodiment of the present invention.

FIG. 2 is a diagram illustrating circuit pattern areas and reticle alignment marks used in accordance with one embodiment of the present invention. The attenuated phase shifting mask 200 according to this embodiment employs a non-linear film to form patterns in the pattern portion 202 of the mask 200 and also to form fiducials (alignment marks) in the border area 206 of the mask. The alignment and peripheral structures in the border area 206 include reticle alignment marks 204 and bar codes and other peripheral structures 208. By using non-linear optical materials in both portions 202 and 206 of the mask, i.e. for both forming pattern features and alignment marks, the process for formation of the reticle may be simplified and defects caused by residual chrome eliminated.

Non-linear optical materials may be deposited on a variety of different substrates, using a variety of different techniques. For example, spray pyrolysis may be used. Spray pyrolysis has been used to produce micro and nanoscale metal powders due to the convenient process characteristics as compared to gas condensation methods such as plasma reactors and laser ablation. The spray pyrolysis procedures can be readily adapted to deposit the non linear optical materials on a semiconductor, mask quartz, or other substrate.

In a typical spray pyrolysis process, an aqueous solution of precursors is atomized and the stream consisting of droplets suspended in a carrier gas is atomized and the stream consisting of droplets suspended in a carrier gas is passed through a tubular furnace. In the furnace the precursor reacts in the solid phase, forming the final product powder. After electrostatic classification using a differential mobility analyzer (DMA), the particles can be deposited onto substrate surfaces using a low-pressure impactor or an electrostatic precipitator. The exact process parameters are dependent upon the film to be deposited and the properties of the film desired. Details and process parameters for application of non-linear optical materials by spray pyrolysis are known to those of skill in the relevant art and therefore further description is deemed unnecessary.

By using the spray pyrolysis techniques described, a non-linear optical film may be deposited in a process having several advantages over conventional processes used for conventional films. The spray pyrolysis technique provides a fast and reproducible technique without the high temperatures or inert atmosphere or vacuum requirements typical of other processes. The film thickness and grain size may be controlled over a wide range. Moreover, multiplayer, patterned, and profiled coatings may be used. Although spray pyrolysis typically entails greater application times this factor should not adversely affect throughput. Mask blanks are typically pre-fabricated by the blank vendor to include the deposition of the requisite film stack. The prefabricated masks are then shipped to the mask manufacturing site. Accordingly, the blank manufacturing processes are not included in the serial flow required for the mask manufacturing process as performed by the end user. Thus, longer cycle times required in the blank manufacturing process would have no effect on the delivery times for IC manufacturers. The non-linear optical materials such as described above have suitably been deposited by this method on several substrates including quartz.

Following deposition of the non-linear optical material, conventional techniques may be used to firm the circuit pattern features and fiducials. For example, reactive ion etching (RIE) as used conventionally for the patterning of attenuated phase shift films on reticles may also be used to pattern the non-linear optical films on the reticles described in embodiments of the present invention. Methods of etching non-linear optical materials, including, for example, RIE are known to those of skill in the relevant art and therefore will not be described further here.

By suitably selecting and sizing the non-linear optical film to a thickness having a first transmission value at the exposure wavelength and a second transmission value at the fiducial recognition wavelength, the reticle may be formed from a single non-linear optical film. That is, the die pattern and the fiducial portions of the reticle may be patterned from the same film, thus eliminating several steps in the mask fabrication process and eliminating the potential for chrome defects.

According to this embodiment of the present invention, the thickness of the non-linear optical film is selected to satisfy the constraints of the features sizes to be patterned. The optical properties of the non-linear optical material are chosen such that they satisfy two constraints, one for the exposure wavelength and one for the fiducial recognition wavelength. That is, the optical properties of the non-linear optical material are selected to provide the desired transmission at the actinic exposure wavelength, which is normally in the Deep UV region. Without intending to be limiting, at the actinic exposure wavelengths transmissions in the range from about 6% to 50% are preferred to provide suitable resolution definition, and more preferably lie in the range from 6% to 50%. The optical properties of the NON-LINEAR OPTICAL material are also selected to provide a small transmission (ideally, close to zero) at the fiducial recognition wavelengths, which are normally in the visible wavelengths. Preferably, the transmission at the fiducial recognition wavelengths will be in the range from 1% to 25%.

In conventional processes, the thickness of the attenuating phase shift film is selected to provide the desired optical properties, i.e., target transmission and usually a 180 degrees phase shift, at the wavelength of operation. That is, the critical optical characteristics of the attenuating film are those at the exposure wavelength. For example, those films formed from MoSi having a thickness of about 900 nm will provide a 6% transmission and 180 degrees phase shift at an exposure wavelength of 248 nm (i.e., deep UV).

In contrast, according to one embodiment of the present invention, the thickness of the film is selected to provide the desired optical properties, i.e., target transmission and phase shift at the exposure wavelength while simultaneously providing substantial contrast (i.e., very low transmission) at the visible wavelength used for fiducial functions. According to one embodiment, the desired thickness may be determined from evaluation of a series of graphs illustrating transmission versus wavelength for different non-linear optical film thickness. That is, for each thickness, the exposure wavelength $\lambda 1$ and the fiducial recognition wavelength $\lambda 2$ are examined. The thickness which provides the selected transmission criteria at both wavelengths is selected for deposition on the mask. The thickness of the non-linear film is dependant on the predetermined transmission values. Preferably, the thickness of the deposited film will range from 300 to 3000 nm. This is usually adjusted to get the desired phase shift at the actinic exposure wavelength.

The optical properties of the non-linear films are a function of deposition conditions and material composition and stoichiometry. Once the non-linear material and the proper n and k properties required to meet the transmission constraints at the two wavelengths are determined, the non-linear optical film deposited on the reticle may be patterned using a resist layer. According to one embodiment, once the optical properties satisfying the above-mentioned constraints are determined, the resist thickness is selected at an inflection of the swing curve according to well established lithographic techniques. The thickness chosen is such that any deviation from this in either direction will result in the smallest possible change in the target pattern dimensions. Any substrate mismatches between the resist and the non-linear material could be accommodated by modifying the resist chemistries. Thus, the non-linear optical film may be suitably patterned using resists selected n accordance with methods known to those of skill in the relevant art.

Figure 3:
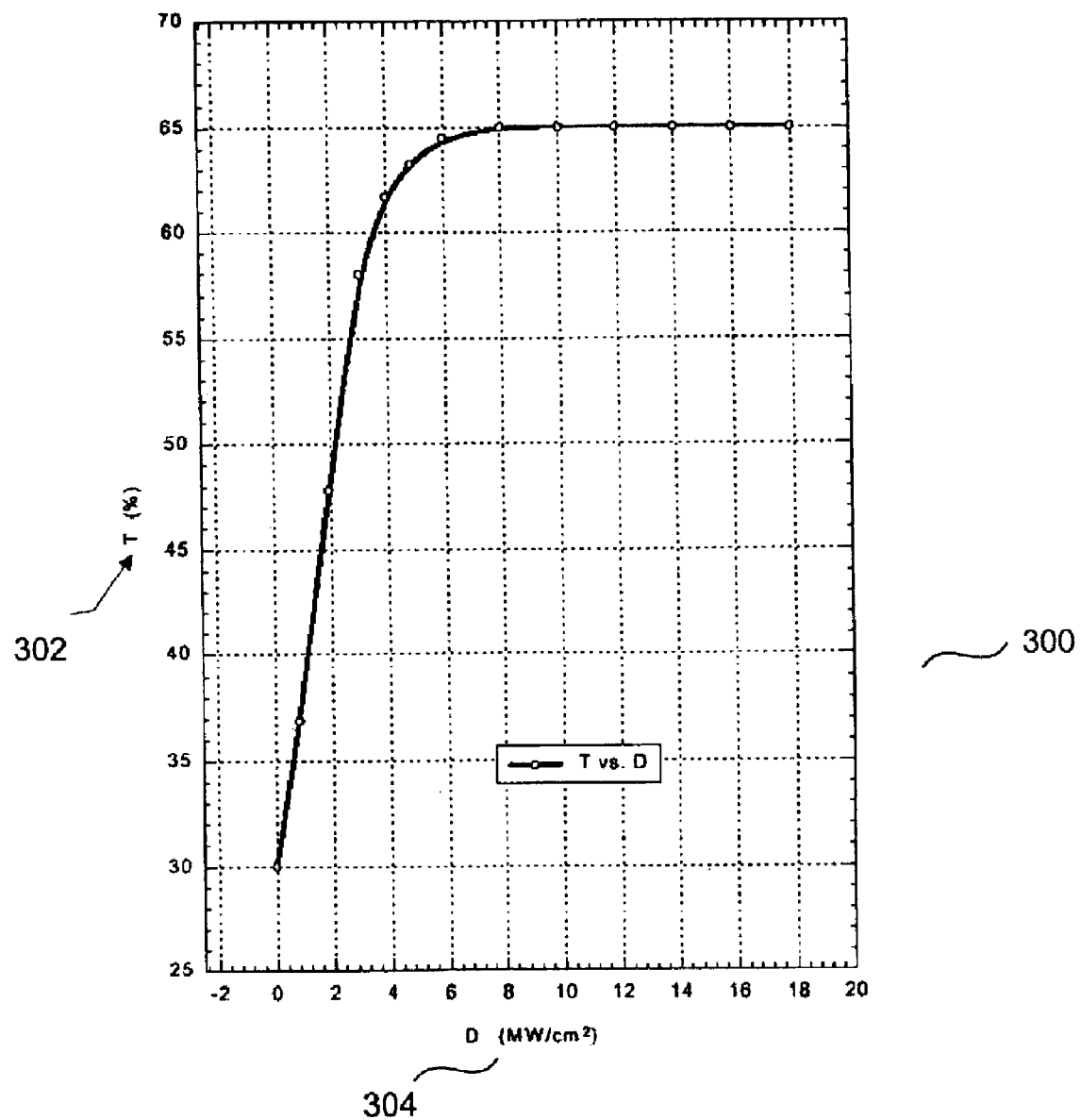
FIG. 3 is a graph illustrating the transmission characteristics of an example non-linear optical (NLO) material suitable for use in attenuating phase shift masks according to one embodiment of the present invention.

FIG. 3 is a graph illustrating the transmission characteristics of an example non-linear optical (NLO) material suitable for use in attenuating phase shift masks according to one embodiment of the present invention. In specific, the transmission characteristics (T) of a lithium fluoride (LiFl) crystal are shown as a function of the incident laser power (D). As illustrated, the transmission percentage reflected on the y-axis 302 increases with increases in incident laser power 304 plotted along the x-axis until a peak value of transmission 306 is reached. The incident laser power is provided for an incident laser having a wavelength of 1064 nm, which is in the infrared region. This laser wavelength is typical of illumination used for fiducial recognition, although lasers of higher and lower frequencies are often used. Thus, the transmission percentage for the lithium fluoride crystal varies from 30 to 65 percent as the incident laser power 304 varies from 0 to 8 mW/cm². By suitable adjusting the intensity of the fiducial illumination, recognition of the fiducials may be achieved using non-linear optical materials such as the example LiFl film illustrated in FIG. 3. Typical power values used in optical lasers range from 8 to 12 mW/cm2.

Figure 4:
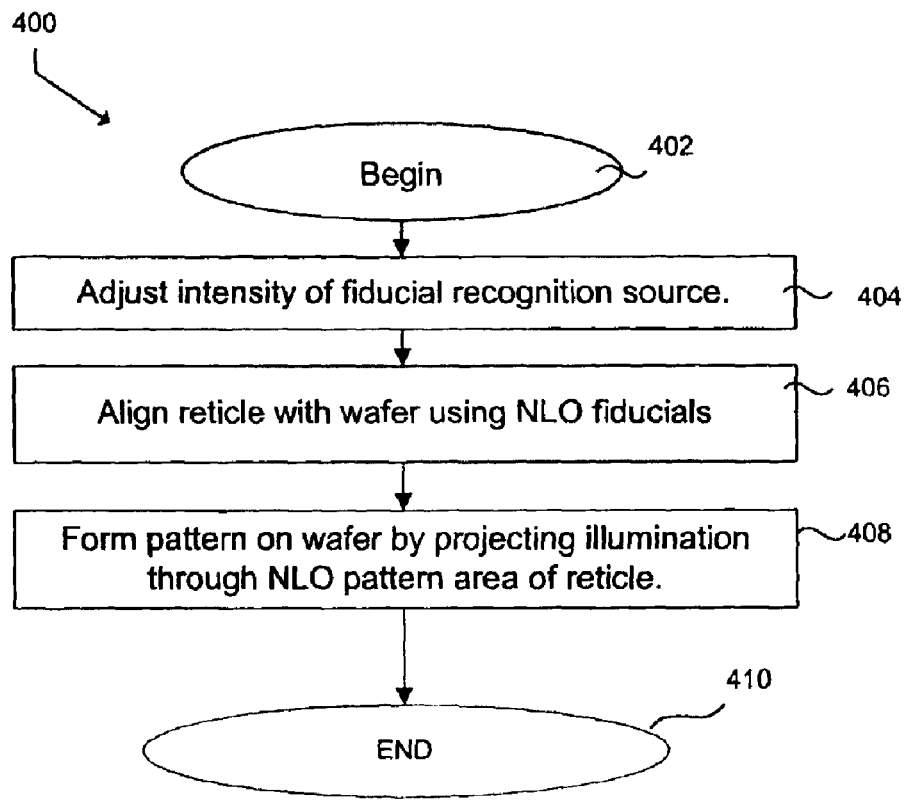
FIG. 4 is a flowchart illustrating a method of forming an integrated circuit on a wafer using a phase shift mask having fiducials and patterns formed from non-linear optical materials in accordance with one embodiment of the present invention.

FIG. 4 is a flowchart illustrating a process 400 of forming an integrated circuit on a wafer using a phase shift mask having fiducials and patterns formed from non-linear optical materials in accordance with one embodiment of the present invention. The process 400 begins at an operation 402 with a reticle having fiducials and patterns formed from a non-linear optical film.

Next, in operation 404, the intensity of the fiducial recognition source is adjusted (or selected in a fixed system) to provide the desired transmission. Preferably, the transmission is minimized to provide opacity or near opacity to better enable alignment using the fiducials. As noted above, non-linear optical materials provide a non-linear transmission that varies in a non-linear fashion with variations in intensity of the illumination source. After adjustment of the intensity, the reticle is aligned with the wafer by using the fiducials formed from the non-linear film in operation 406. That is, the fiducials in the border area of the reticle are used to align the reticle and wafer for printing of the patterns on the die.

Next, in operation 408, the pattern is formed on the wafer by projecting illumination from the exposure source, through the reticle having the pattern formed from a non-linear optical film. The process ends at operation 410.

By using the non-linear optical films as described herein, a single film may be used on top of the reticle substrate and the use of chrome avoided. Thus, elimination on the second film (i.e., the chrome layer) and the associated patterning of the second layer simplifies the process and reduces the risk of defects.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A phase shift mask for forming a pattern on a semiconductor wafer, the phase shift mask comprising:
   a pattern feature formed in a portion of the mask to be imaged and printed on a wafer, wherein the pattern feature is formed from a non-linear optical material; and
   a fiducial formed from the non-linear optical material.

2. The phase shift mask recited in claim 1 wherein the phase shift mask is an attenuated phase shift mask.

3. The phase shift mask recited in claim 1 wherein the non-linear optical material is one of lithium fluoride, Lithium Niobate (LiNbO3), Potassium Titanyl Phosphate (KTiOPO4), and Rubidium Titanyl Phosphate (RbTiOPO4).

4. The phase shift mask recited in claim 1 wherein the non-linear optical material is an organic material.

5. The phase shift mask recited in claim 1 wherein the non-linear optical material has a substantially uniform thickness and the thickness is selected to provide a predetermined phase and a first transmission at the pattern exposure wavelength and a second transmission at wavelengths used for fiducial recognition functions, and wherein the second transmission is lower than the first.

6. The phase shift mask recited in claim 5 wherein the second transmission is minimized.

7. The phase shift mask recited in claim 1 wherein the transmission through the non-linear optical material at the pattern exposure wavelength lies in the range from 6% to 50%.

8. The phase shift mask recited in claim 1 wherein the transmission through the non-linear optical material at the fiducial recognition wavelength lies in the range from 1% to 25%.

9. The phase shift mask recited in claim 1 wherein the thickness of the nonlinear optical material lies in the range from 300 to 3000 nm.

10. The phase shift mask recited in claim 1 wherein the non-linear optical material is deposited by spray pyrolysis on a quartz surface of the reticle.

11. A method of forming a pattern on a semiconductor wafer, the method comprising:
    aligning an attenuating phase shift mask with one of a stepper and a wafer, by projecting a fiducial recognition illumination source through at least one fiducial formed from a non-linear optical material;
    forming a feature pattern on the wafer by projecting illumination through phase shift mask feature patterns formed from the non-linear optical material.

12. A method of forming a pattern on a semiconductor wafer as recited in claim 11, wherein the alignment between the fiducials on the phase shift mask pattern is performed by projecting a visible light source through the fiducial.

13. A method of forming a pattern on a semiconductor wafer as recited in claim 11, wherein the thickness of the non-linear optical material is selected to provide a predetermined phase and transmission at the exposure wavelength and a second lower transmission at the visible wavelength used for the fiducial functions.

14. A method of forming a pattern on a semiconductor wafer as recited in claim 11 wherein the intensity of the fiducial recognition source is adjusted to provide a predetermined transmission through the fiducial.

15. A method of forming a pattern on a semiconductor wafer as recited in claim 11 wherein the intensity of the fiducial recognition source is adjusted to minimize the transmission through the fiducial.

16. A method of forming a pattern on a semniconductor wafer as recited in claim 11 wherein the fiducial recognition illumination source has a lower frequency than the source used for exposing the pattern.

17. A method of forming a pattern on a semiconductor wafer as recited in claim 11 wherein the non-linear optical material is one of lithium fluoride, Lithium Niobate (LiNbO3), Potassium Titanyl Phosphate (KTiOPO4), and Rubidium Titanyl Phosphate (RbTiOPO4).

18. A method of forming an attenuated semiconductor phase shift mask for forming a pattern on a semiconductor wafer, the method comprising:
    forming the patterned feature portion of the mask from a non-linear optical material; and
    forming the fiducials from the non-linear optical material.

19. The method of forming an attenuated phase shift mask as recited in claim 18, wherein the non-linear optical material is one of lithium fluoride, Lithium Niobate (LiNbO3), Potassium Titanyl Phosphate (KTiOPO4), and Rubidium Titanyl Phosphate (RbTiOPO4).

20. The method of forming an attenuated phase shift mask as recited in claim 18, wherein the non-linear optical material has a substantially uniform thickness and the thickness is selected to provide a predetermined phase and transmission at the pattern exposure wavelength and a second transmission at visible wavelengths used for fiducial functions, and wherein the second transmission is lower than the first.

* * * * *